(12) United States Patent
Nadeau-Dostie et al.

(10) Patent No.: US 7,155,651 B2
(45) Date of Patent: Dec. 26, 2006

(54) CLOCK CONTROLLER FOR AT-SPEED TESTING OF SCAN CIRCUITS

(75) Inventors: Benoit Nadeau-Dostie, Gatineau (CA); Jean-François Côté, Chelsea (CA)

(73) Assignee: LogicVision, Inc., San Jose, CA (US)

(*) Notice: Subject to any disclaimer, the term of this patent is extended or adjusted under 35 U.S.C. 154(b) by 194 days.

(21) Appl. No.: 11/013,319

(22) Filed: Dec. 17, 2004

(65) Prior Publication Data

US 2005/0240847 A1 Oct. 27, 2005

Related U.S. Application Data

(60) Provisional application No. 60/564,210, filed on Apr. 22, 2004.

(51) Int. Cl.
*G01R 31/28* (2006.01)
(52) U.S. Cl. ..................... 714/731; 714/729
(58) Field of Classification Search ............... 375/376; 713/322; 714/30, 731, 729, 726
See application file for complete search history.

(56) References Cited

U.S. PATENT DOCUMENTS

| | | | |
|---|---|---|---|
| 6,115,439 A * | 9/2000 | Andresen et al. | ........... 375/376 |
| 6,115,827 A | 9/2000 | Nadeau-Dostie et al. | |
| 6,145,105 A | 11/2000 | Nadeau-Dostie et al. | |
| 6,327,684 B1 | 12/2001 | Nadeau-Dostie et al. | |
| 6,330,681 B1 * | 12/2001 | Cote et al. | ................... 713/322 |
| 6,442,722 B1 | 8/2002 | Nadeau-Dostie et al. | |
| 6,467,044 B1 | 10/2002 | Lackey | |
| 6,510,534 B1 | 1/2003 | Nadeau-Dostie et al. | |
| 6,665,817 B1 * | 12/2003 | Rieken | ........................ 714/30 |
| 6,877,123 B1 * | 4/2005 | Johnston et al. | ............. 714/731 |
| 6,954,887 B1 * | 10/2005 | Wang et al. | ................. 714/729 |
| 6,966,021 B1 * | 11/2005 | Rajski et al. | ................ 714/726 |
| 7,007,213 B1 * | 2/2006 | Wang et al. | ................. 714/729 |

* cited by examiner

*Primary Examiner*—David Ton
(74) *Attorney, Agent, or Firm*—Eugene E. Prouix

(57) ABSTRACT

A test clock controller for generating a test clock signal for scan chains in integrated circuits having one or more clock domains, comprises a shift clock controller for generating a shift clock signal for use in loading test patterns into scan chains in the clock domains and for unloading a test response patterns from the scan chains and for generating a burst phase signal after loading a test pattern; and a burst clock controller associated with each of one or more clock domains and responsive to a burst phase signal for generating a burst of clock pulses derived from a respective reference clocks and including a first group of burst clock pulses having a selected reduced frequency relative to the reference clock and a second group of burst clock pulses having a frequency corresponding to that of the reference clock.

29 Claims, 7 Drawing Sheets a) Alignment on Last Active Edge b) Alignment on Penultimate Active Edge

CLOCK CONTROLLER FOR AT-SPEED TESTING OF SCAN CIRCUITS

CROSS-REFERENCE TO RELATED APPLICATIONS

This application claims the benefit of U.S. Provisional Patent Application Ser. No. 60/564,210 filed Apr. 22, 2004, incorporated herein by reference.

BACKGROUND OF THE INVENTION

1. Field of the Invention

The present invention generally relates to testing of integrated circuits and more, specifically, to a clock controller for use in at-speed testing of scan circuits.

2. Description of Related Art

Scan circuits are well known and generally consist of logic and scan chains comprised of memory elements which can be configured in a scan mode and a capture mode. The scan mode is used for shifting test patterns into the memory elements and for shifting the circuit response to the test patterns out of the memory elements. The capture mode is used to capture and store the response of the circuit in the memory elements.

An at-speed test is typically performed by applying a short burst of two clock cycles to launch the test pattern shifted in and capture the output response of the circuit. In some cases, the launching is performed while the memory elements of the circuit are configured in shift mode (launch-from-shift), while in other cases, the memory elements are configured in capture mode (launch-from-capture). Short bursts are not appropriate to test for complex failure mechanisms such as power supply noise, IR-drop, signal coupling, etc . . . and longer bursts need to be used. Ideally, the level of activity of the circuit during the burst phase should approximate that which occurs during normal operation of the circuit. This can be achieved by modifying the burst length and/or the instantaneous frequency of the burst. For interacting synchronous domains, an additional characteristic is the alignment of selected clock edges during the burst.

Lackey U.S. Pat. No. 6,467,044 issued on Oct. 15, 2002 for "On-board Clock-control Templates for Testing Integrated Circuits" is concerned with problems associated with testing integrated circuits having multiple clock domains. More specifically, Lackey is concerned with a clocking methodology that will generate clock waveforms for all clock domains from a single clock. Lackey provides templates in the form of registers containing bits that enable/disable the capture clock(s), to provide for maximum flexibility in describing clock waveforms. The approach proposed by Lackey suffers from a number of disadvantages. The size of the registers become prohibitive for long burst lengths. The patent does not disclose how to perform an at-speed test of all clock domains at the same time if the clocks are not multiples of each other because all capture clocks are derived from a single capture clock source. Further, the patent does not specifically address how to handle interacting synchronous clock domains and the disclosed method applies only to the Level Sensitive Scan Design (LSSD) style. The muxed-scan design style is more commonly used. The clocked-scan design styles is also used in high-performance designs.

SUMMARY OF THE INVENTION

The present invention seeks to provide a test clock controller and at-speed scan test method which overcomes the aforementioned difficulties and which can be used with methods such as those described in Applicants' U.S. patent application Ser. No. 10/739,055 filed on Dec. 12, 2003, Ser. No. 09/773,541 filed on Feb. 2, 2001, and Ser. No. 09/607,128 filed on Jun. 29, 2000, now U.S. Pat. No. 6,510,534 issued on Jan. 21, 2003, or any other scan test method requiring the generation of a burst of clock cycles from a system clock source.

More specifically, the present invention seeks to provide a method and test clock controller capable of simultaneously testing at-speed (or higher to compensate for favorable process and operating conditions) all clock domains, including interacting synchronous domains, of a circuit and apply any number of clock cycles at-speed during a burst phase. At-speed means that the clock period of the clock in each clock domain is substantially the same as that used during normal operation of the circuit.

One aspect of the present is generally defined as a method for at-speed testing of integrated circuits having one or more clock domains, the method having a shift phase for loading test patterns into scan chains in the clock domains and unloading test response patterns from the scan chains, and a burst phase for launching a test pattern and capturing circuit responses to the test patterns. The method comprises, generating a burst phase signal following the shift phase; and for each clock domain, synchronizing the burst phase signal with a reference clock signal of the clock domain; generating a burst of clock cycles derived from a reference clock signal associated with the clock domain, including generating a first number of the cycles at a reduced frequency by disabling a second number of cycles following each of the first number of cycles and generating remaining cycles of the burst of clock cycles at the frequency of the reference clock signal.

Another aspect of the present invention is generally defined as An at-speed scan test method for testing a circuit having of interacting synchronous clock domains, the method having a shift phase for loading test patterns into scan chains in the clock domains and unloading test response patterns from the scan chains, and a burst phase for launching test patterns and capturing circuit responses to the test patterns. The method comprises generating a burst phase signal following the shift phase; synchronizing the burst phase signal with a reference clock associated with the clock domain having the lowest clock frequency; and, for each clock domain: generating a burst of clock cycles derived from a reference clock signal associated with the clock domain; and, prior to the generating a burst of clock cycles, delaying commencement of the burst of clock cycles by a predetermined time interval so as to align a selected edge of the burst of clock cycles with a corresponding edge in all other interacting synchronous clock domains.

A further aspect of the present invention is generally defined as a test clock controller for generating a test clock signal for scan chains in integrated circuits having one or more clock domains, comprising: a shift clock controller for generating a shift clock signal for use in loading test patterns into scan chains in the clock domains and for unloading a test response patterns from the scan chains and for generating a burst phase signal after loading a test pattern; and a burst clock controller responsive to a burst phase signal for generating a burst of clock pulses derived from a reference clock and including a first group of clock pulses having a selected reduced frequency relative to the reference clock and a second group of clock pulses having a frequency corresponding to that of the reference clock.

BRIEF DESCRIPTION OF THE DRAWINGS

These and other features of the invention will become more apparent from the following description in which reference is made to the appended drawings in which.

DESCRIPTION OF EMBODIMENTS OF THE INVENTION

Figure 1:
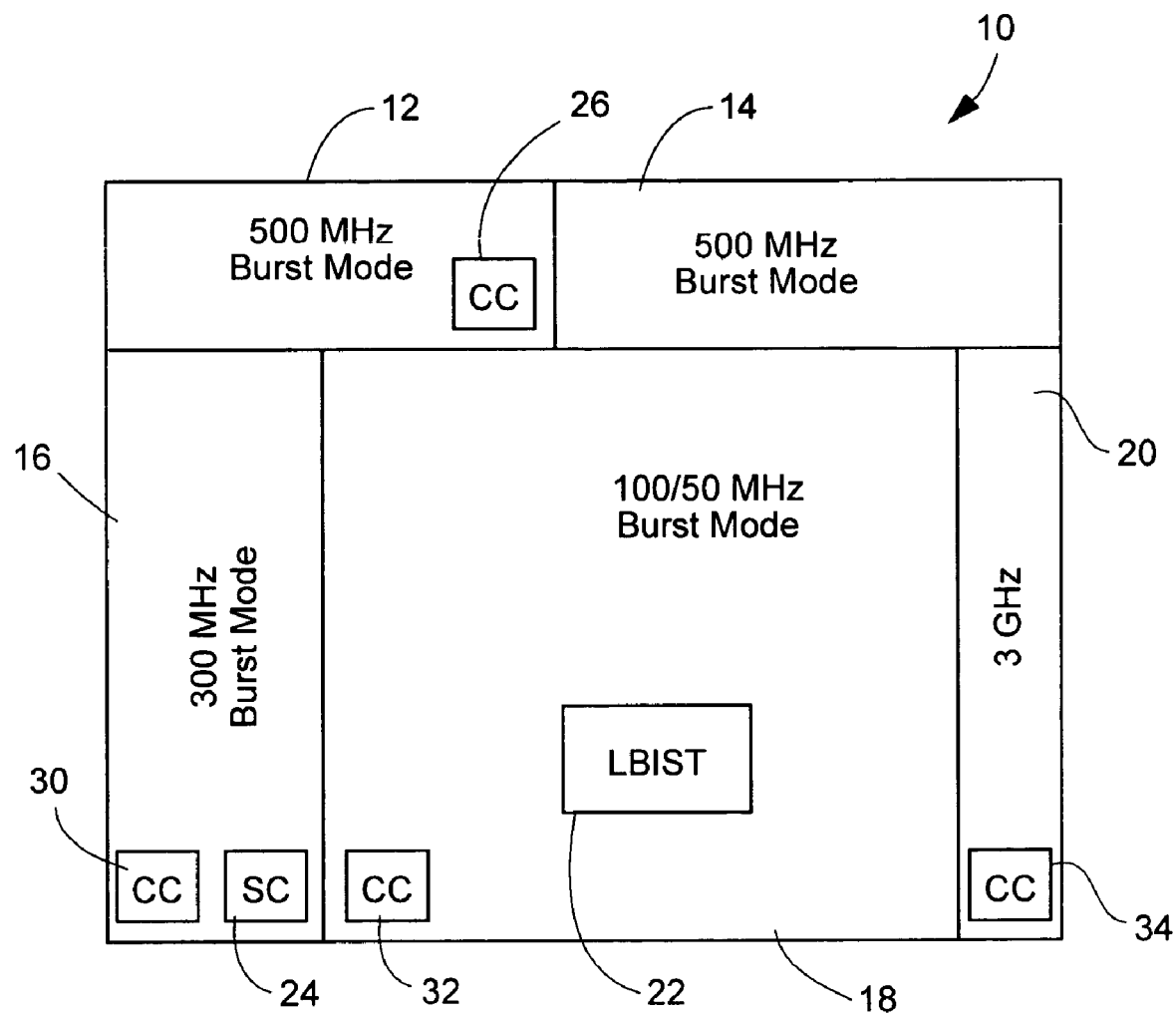
FIG. 1 illustrates a circuit with multiple clock domains and showing how a shift clock controller resides in one clock domain and burst clock controllers reside in the same or other domains.

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

One aspect of the present invention provides a test clock controller to control, during a shift phase, the loading of test patterns and unloading of test response patterns into and from scan chains of an integrated circuit and to apply, during a burst phase, a burst of clock cycles derived from a reference clock in which the pattern is launched and the response of the circuit is captured. The test clock controller includes a shift clock controller which controls shift operations during the shift phase and one or more burst clock controllers which generate burst clock pulses during the burst phase.

The circuit may have one or more clock domains, which can be asynchronous or synchronous. In one embodiment, a burst clock controller is associated with each clock domain. The reference clock used during the burst phase is preferably the functional clock source, in order to perform an at-speed test, but it can be any other clock source. In another embodiment, a burst clock controller is associated with or controls more than one clock domain. Asynchronous clock domains receive the same reference clock during test and no effort is required to align the clocks. In synchronous clock domains, functional clock sources are used as the reference clock during the burst phase so that clock alignment is the same as that used during normal operation of the circuit. The functional clock sources may be, for example, a Phase-Locked Loop (PLL) or a functional clock divider. An alternative reference clock source is the shift clock that is distributed to all synchronous clock domains.

The present invention also provides a method of performing an at-speed test of an integrated circuits having one or more clock domains. One aspect of the method is directed to the manner in which clock cycles are applied during the burst phase. This aspect involves generating a first number of clock cycles at a reduced frequency relative to that of the reference clock by disabling a second number of reference clock cycles following each of the first number of cycles and generating remaining cycles of the burst of clock cycles at the frequency of the reference clock.

Another aspect of the method is directed to the manner in which a selected edge of the burst phase clock of interacting synchronous clock domains are aligned. This aspect of the method is achieved by delaying commencement of the burst of clock cycles by a predetermined time interval after a burst phase signal becomes active so as to align a selected edge of each domain with a corresponding edge in all other interacting synchronous clock domains.

FIG. 1 illustrates an integrated circuit 10 having a plurality of clock domains. Five clock domains are shown, including two 500 MHz asynchronous clock domains 12 and 14, a 300 MHz asynchronous clock domain 16, a 100/50 MHz synchronous clock domain group 18 which includes two interacting synchronous clock domains, and a 3 GHz asynchronous clock domain 20. A logic BIST controller 22 resides in clock domain 18. Other embedded test controllers may also be included in the circuit. As shown in FIG. 1, a shift clock controller 24 is located in clock domain 16 and is shared by all clock domains, i.e., it is used to control the loading of test patterns into any or all of the clock domains and, similarly, control the unloading of test response data from all or any of the clock domains. A burst clock controller 26 is included in clock domain 12 and is shared by clock domains 12 and 14, which operate at the same frequency. Each of the remaining clock domains 16, 18 and 20 is provided with respective burst clock controllers 30, 32 and, 34, respectively.

Figure 2:
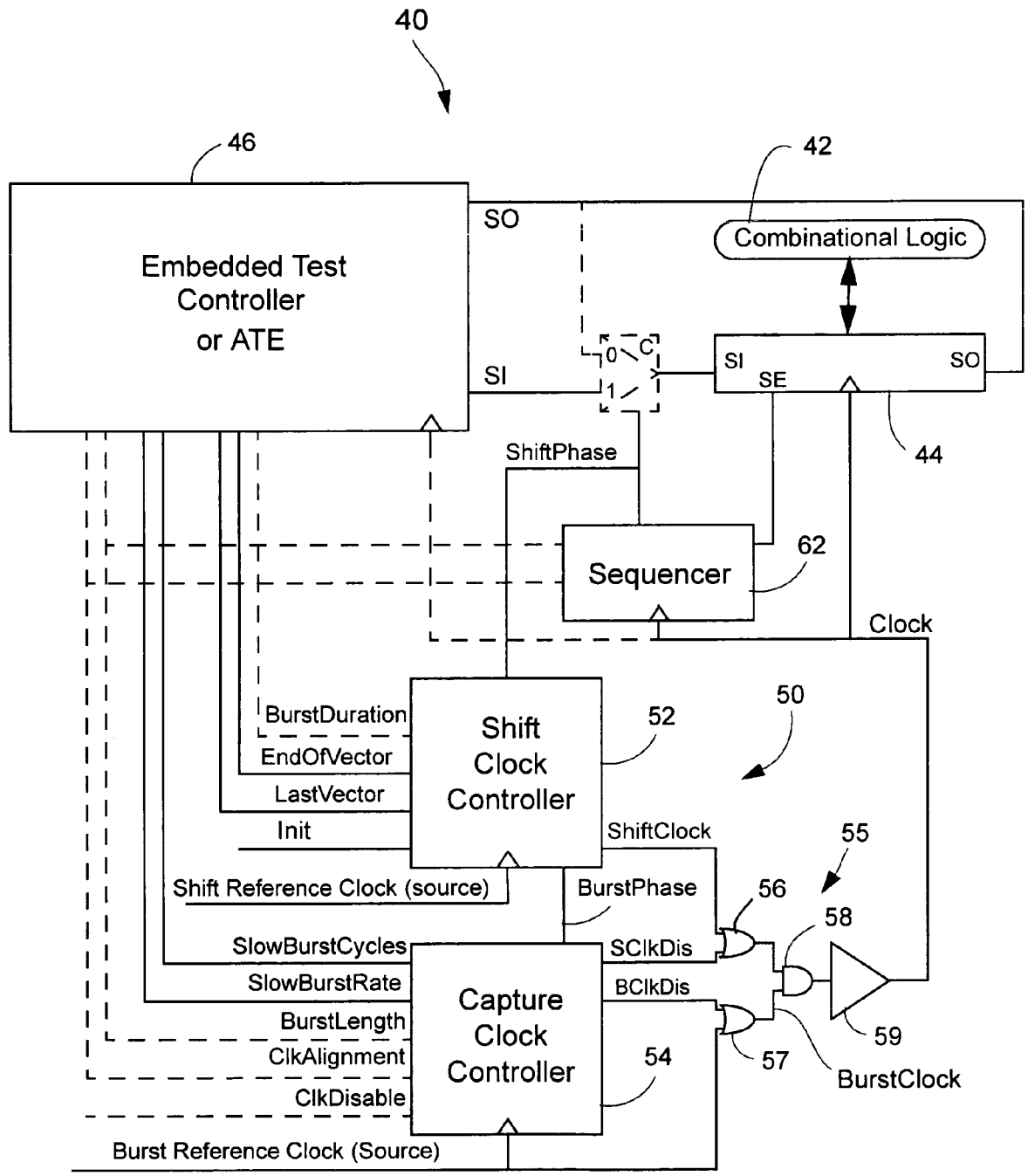
FIG. 2 illustrates a simple circuit having one scan chain with a serial input SI, a serial output SO, a scan enable input SE and a clock input with a shift clock controller and a burst clock controller according to an embodiment of the present invention.

FIG. 2 illustrates a simple circuit 40 which has combinational logic 42 and one scan chain 44. For simplicity, only one scan chain has been shown; however, it will be understood by those skilled in the art that the circuit may include a plurality of scan chains. The scan chain includes a serial input SI and a serial output SO and memory elements (not shown) which are configurable in scan mode in response to an active scan enable signal, SE, and in capture mode in response to an inactive scan enable signal. The memory elements may also be configured in a hold mode in response to additional control signals not shown. The memory elements operate under control of a clock signal, labeled Clock in the figure. As is well known in the art, in scan mode, the memory elements are connected in series between the serial input and the serial output of the scan chain to allow scan data to be shifted into the memory elements and unloaded from the memory elements in response to the clock signal. In capture mode, the memory elements are connected to the combinational logic in parallel—the mode used during normal operation of the circuit. The serial input and output of each scan chain are connected to a corresponding output and input of an embedded test controller or of an ATE (Automated Test Equipment) 46.

In accordance with the present invention, the Clock signal is generated by test clock controller 50 which is comprised of a shift clock controller 52 and a burst clock controller 54. As indicated above, additional clock controllers may be provided if there is more than one clock signal. The shift and burst clock controllers are coupled to a clock gating circuit 55 and are connected to free-running reference shift clock and reference burst clock sources, as shown. The gating circuit includes an OR gate 56 which couples the shift clock signal output by the shift clock controller with a shift clock disable signal, SClkDis, output by the burst clock controller, and OR gate 57 which couples a burst clock reference signal source with a reference clock disable signal, BClkDis, output by the burst clock controller and an AND gate 58 which receives the outputs of OR gates 56 and 57. The output of OR gate 57 is a BurstClock signal. The output of the AND gate is applied to a clock buffer 59. SClkDis is active throughout the burst phase. Thus, one input of the AND gate is always high. The burst clock controller sets the value of BClkDis to control both the commencement and frequency of the burst clock pulses.

Shift Clock Controller

Figure 3:
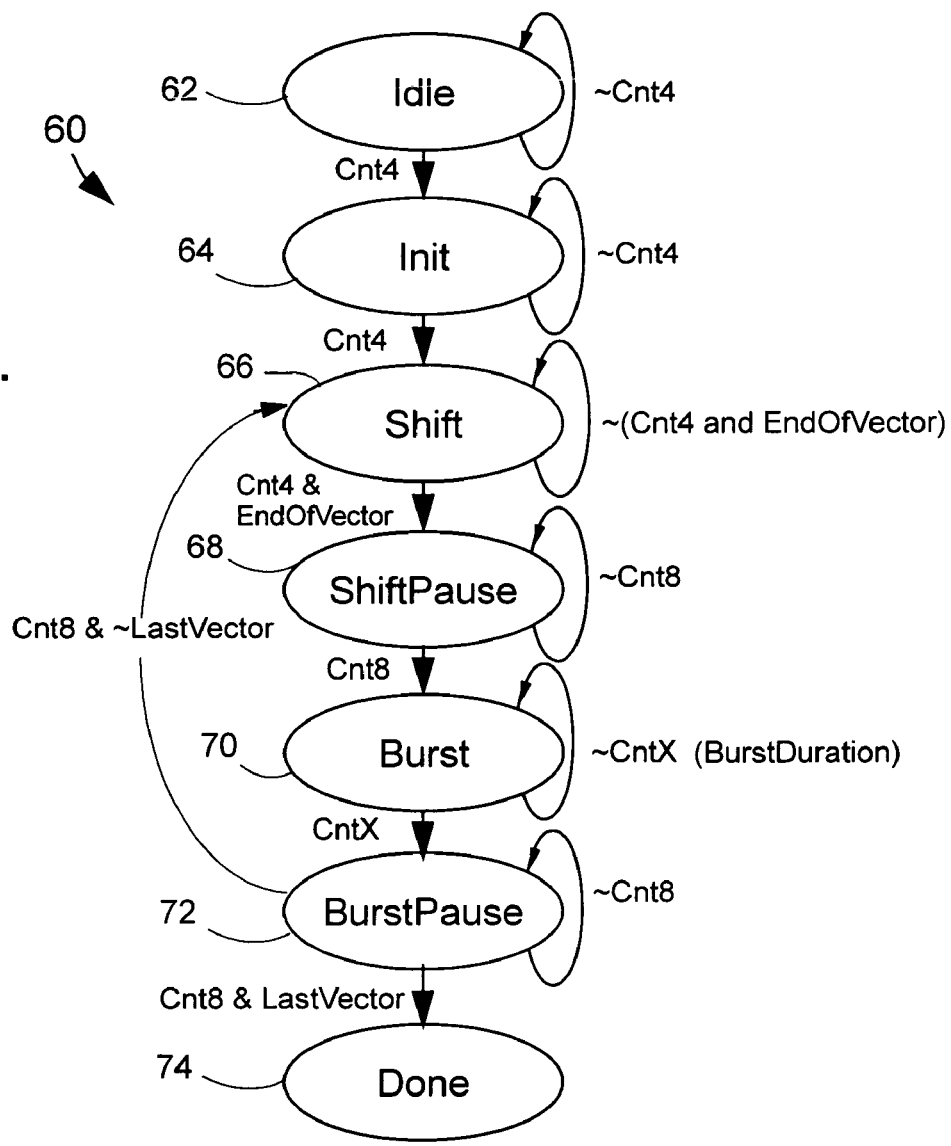
FIG. 3 illustrates a shift clock controller Finite State Machine (FSM) state diagram, according to an embodiment of the present invention.
Figure 4:
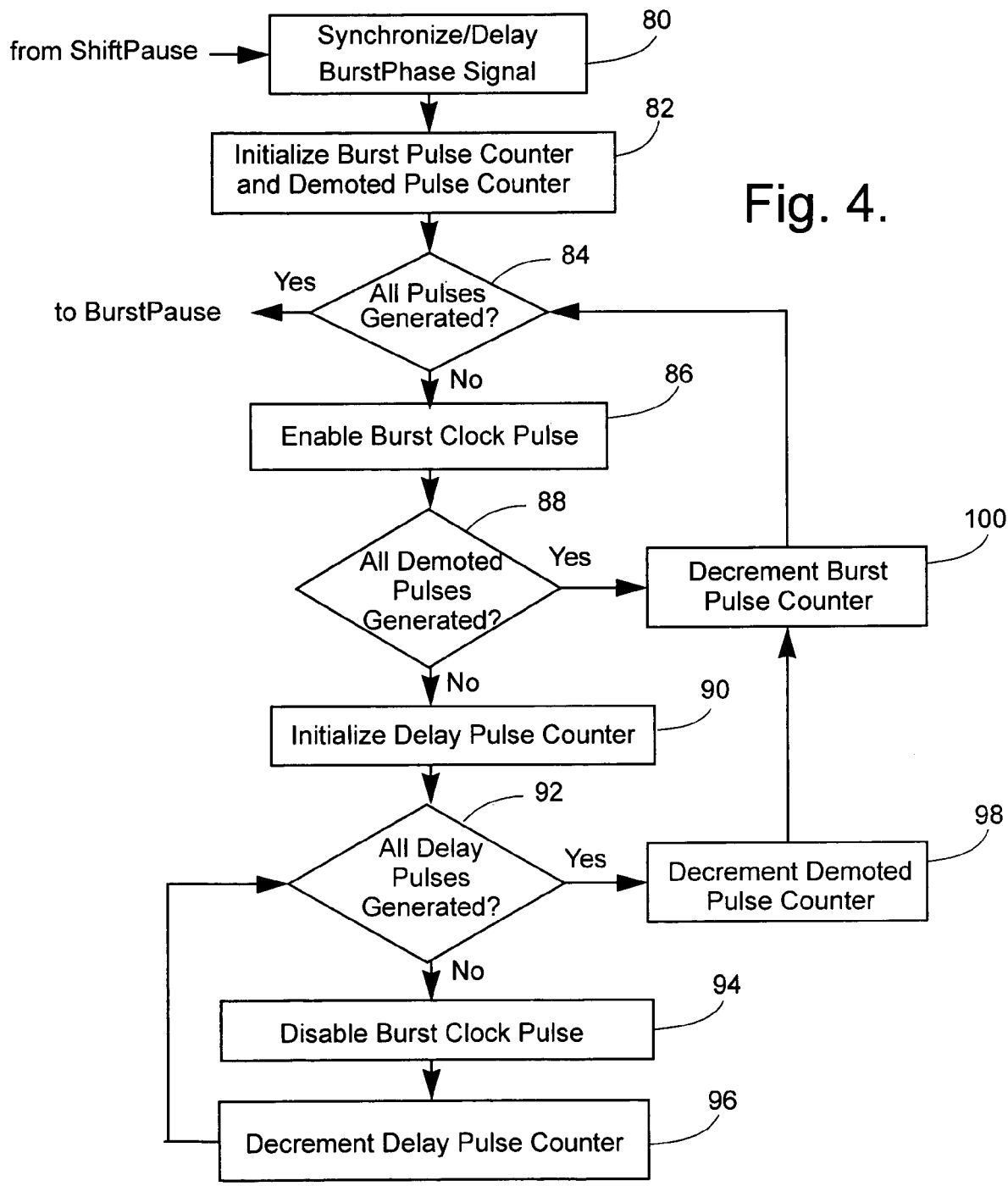
FIG. 4 illustrates a burst clock controller FSM flow diagram, according to an embodiment of the present invention.

The shift clock controller includes circuitry (not shown, but well known in the art) that enables groups of shift clock pulses during a shift phase and a burst phase. The shift clock controller also generates a signal, ShiftPhase, indicative of the shift phase and another signal, BurstPhase, indicative of the burst phase. The shift clock controller includes a circuit in the form of a Finite State Machine (FSM) and counters (not shown). A state diagram 60, showing the states of the shift clock controller FSM, is shown in FIG. 3 and described below. Similarly, each burst clock controller includes a circuit in the form of an FSM. A flow diagram of the burst clock controller FSM is shown in FIG. 4 and is described later.

The ShiftPhase signal is output by the shift clock controller to logic test controller 46, a sequencer 62, if provided, and, to a set of scan chains associated with each clock domain. The ShiftPhase signal is connected directly, or indirectly through the sequencer, to the scan chains. The sequencer is an optional element, as indicated. The sequencer is not necessary when the burst phase includes only capture cycles (i.e., none of the memory elements is configured in shift or hold mode). When present, an embedded test controller would typically be configured in a hold mode in response to an inactive ShiftPhase signal. The test controller holds its current state until the burst phase has ended because the circuit is not ready to receive new test patterns and the output response is not yet available to be shifted out. The BurstPhase signal is output to each burst clock controller 54 in the circuit.

Figure 6:
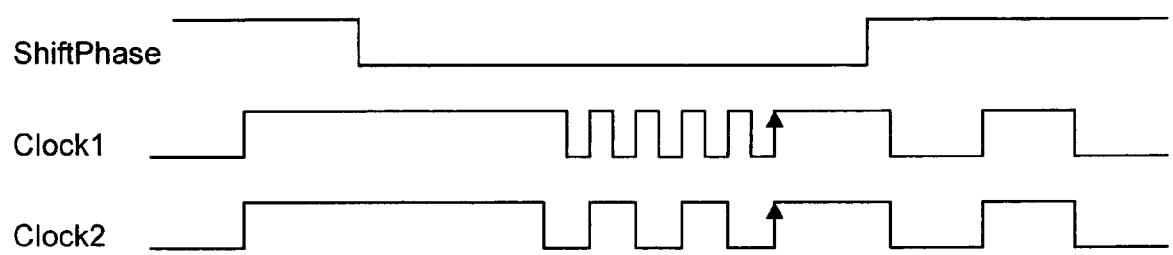
FIG. 6 is a timing diagram illustrating aligned clocks for two interacting synchronous clock domains having different burst clock frequencies and including one combination in which the two clocks are aligned on the last active edge of the burst phase and another combination in which the clocks are aligned on the penultimate edge of the burst phase.
Figure 6:
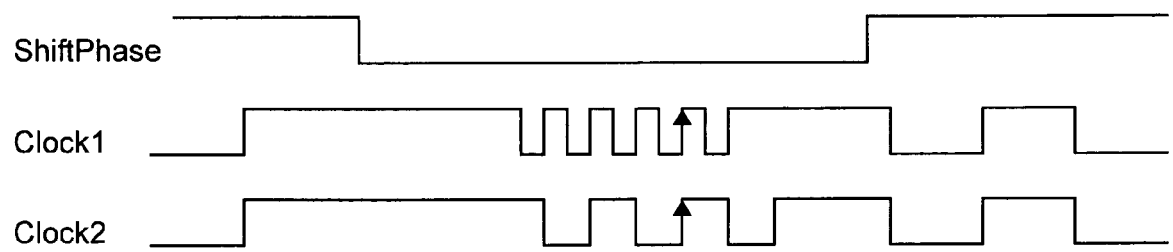

The shift clock controller receives, as input, an EndOfVector signal and a LastVector signal. Both signals are generated by either a logic test controller or a tester. An active EndOfVector signal indicates that the current group of shift clock cycles will be sufficient to complete loading of a test vector into the scan chains and that no further shift clock pulses should be enabled during the shift phase. The number of shift clock pulses that are applied to load all memory elements of the scan chain is rounded up to a number which is a multiple of the number of pulses in a group of shift clock pulses. The number of pulses is chosen such that the timing between the shift clock controller and the logic test controller (or tester) is not critical. An active LastVector signal indicates that no further vectors will be applied to the circuit and causes the shift clock controller to inhibit the generation of additional shift clock pulses (by setting signal, DIS, high in FIG. 6), generate inactive ShiftPhase and BurstPhase signals and move to the Done state of the shift controller FSM.

An embodiment of the shift clock controller FSM is shown in FIG. 3. The FSM has seven states. An Idle state 62 is a state in which the FSM remains when inactive and Init state 64 is a state which initializes the circuitry and asserts the ShiftPhase signal. After initialization, the FSM proceeds to a Shift state 66, during which test patterns are shifted into the scan chains under control of the ShiftClock signal, until a predetermined clock count has been reached and an EndOfVector signal has been received. Once test patterns have been shifted into the scan chains, the FSM enters the ShiftPause state and de-asserts the ShiftPhase signal in the middle of the state. After a predetermined pause, the shift clock controller proceeds to Burst state 70, during which a BurstPhase signal is generated. A launch and capture operation is performed by the circuit during this state. The shift clock controller is idle during this state (Optionally, the shift clock controller may generate bursts of shift clock cycles during this state) for a duration indicated by a BurstDuration input. BurstDuration is chosen so as to provide at least the time required for all burst clock controllers to complete the entire cycle illustrated in the flow diagram of FIG. 4. BurstDuration can be a fixed value decided at design time or run-time programmable value to offer more flexibility. When the burst operation is complete, the shift clock controller FSM de-asserts the BurstPhase signal and enters BurstPause state 72, which produces a second pause, asserts ShiftPhase, and then returns to the Shift state to load another test vector. States Shift, ShiftPause, Burst, and BurstPause are repeated until the LastVector signal is received by the shift clock controller indicating that all vectors have been processed. After completing the processing of the last vector or test pattern, the FSM proceeds to Done State 74.

Burst Clock Controller

The burst clock controller includes circuitry that generates a burst of clock pulses during a burst phase. The frequency of the clock pulses is preferably chosen to be representative of the frequency of the clock pulses used during the normal operation of the circuit. The number of clock pulses may be chosen to test the short term power consumption characteristics (IR-drop) as well as other parasitic effects (crosstalk) of the circuit. Typically, more than two clock pulses are required to provide a representative test. The exact number of burst clock pulses is not always known before fabrication. Accordingly, each clock controller is designed to apply a variable or programmable number of clock pulses at the preferred frequency. However, a variable number of clock pulses causes a change in the output response of the circuit under test. Applicants' application Ser. No. 10/739,055, discloses a method and circuit for configuring the scan chains in a non-capture mode for all but the last burst clock pulse and then configure the scan chains in capture mode for the last pulse during the burst phase. When a reduced number of clock pulses is needed, some of the pulses are replaced by shift clock pulses to keep the number of clock cycles constant during the burst phase.

The present invention instead applies a predetermined or fixed number of clock pulses derived from the reference clock source but "demotes" some pulses so that the effective frequency of the clock pulses is reduced. A demoted clock pulse is a pulse which is followed by disabled or suppressed clock pulses of the free running reference clock signal. This will be better understood by reference to FIG. 4 described below. The number of demoted pulses and the number of following disabled pulses are programmatically controlled by applying a SlowBurstCycles signal and a SlowBurstRate signal, respectively, to the burst clock controllers. The SlowBurstCycles signal indicates the number of reference clock cycles to be demoted. The SlowBurstRate signal indicates the number of burst clock pulses to be suppressed after a demoted clock pulse has been generated. These signals are applied to all burst clock controllers. The same signals can be shared or not by several burst clock controllers. FIG. 4 illustrates a flow diagram of the burst clock controller FSM which is operative during Burst state 70 of the shift clock controller FSM and illustrates how burst clock controllers use these signals.

As previously mentioned, the shift clock controller FSM enters Burst state 70 after exiting the ShiftPause state. In general, after the shift phase has completed, the shift clock controller generates a BurstPhase signal which is delivered to all burst clock controllers. This signal activates the burst clock controller FSMs.

Circuitry associated with the burst clock controllers sets the burst clock disable signal, BClkDis, to a high or low value on each pulse of the burst reference clock so as to either enable or suppress a clock pulse until a predetermined number (SlowBurstCycles) of demoted clock pulses, if any, have been generated. This allows for generating a demoted pulse and then selectively suppressing a number (SlowBurstRate) of reference clock source pulses to produce a burst of clock pulses at a lower frequency than that of the reference clock signal source. After all demoted pulses have been generated, clock pulses are generated on each pulse of the reference clock signal source until a predetermined total number (BurstLength) of clock pulses have been generated. It will be noted that SlowBurstCycles and SlowBurstRate may be set to zero if no reduced frequency burst clock cycles are desired.

Referring to FIG. 4, step 80 synchronizes the BurstPhase signal, or a delayed version of it, with the reference clock signal used in the clock domain. The synchronization may involve a short delay. Step 82 then initializes a pulse counter (not shown) to a specified BurstLength value, and a demoted pulse counter (not shown) to a specified SlowBurstCycles value. Step 84 determines whether all specified burst clock pulses (BurstLength) have been generated and executes steps 86 through 100 until this occurs. Step 86 enables a clock pulse by setting BClkDis low.

Step 88 determines whether all demoted pulses have been generated and, if not, executes steps 90 through 98. Step 90 initializes a delay pulse counter (not shown) to a specified SlowBurstRate value. Steps 92 through Step 96 are repeated a number of times corresponding to the value of SlowBurstRate. Step 94 sets BClkDis high to disable a clock pulse and step 96 decrements the delay counter. Thus, each time the steps are repeated, a pulse is disabled or suppressed. When the number of specified disabled pulses has been generated, the demoted pulse counter and the pulse counter are decremented at steps 98 and 100.

When all demoted clock pulses have been generated, as determined at step 88, the remaining number of clock cycles required by BurstLength are generated by cycling through steps 84, 86, 88 and 100.

Figure 5:
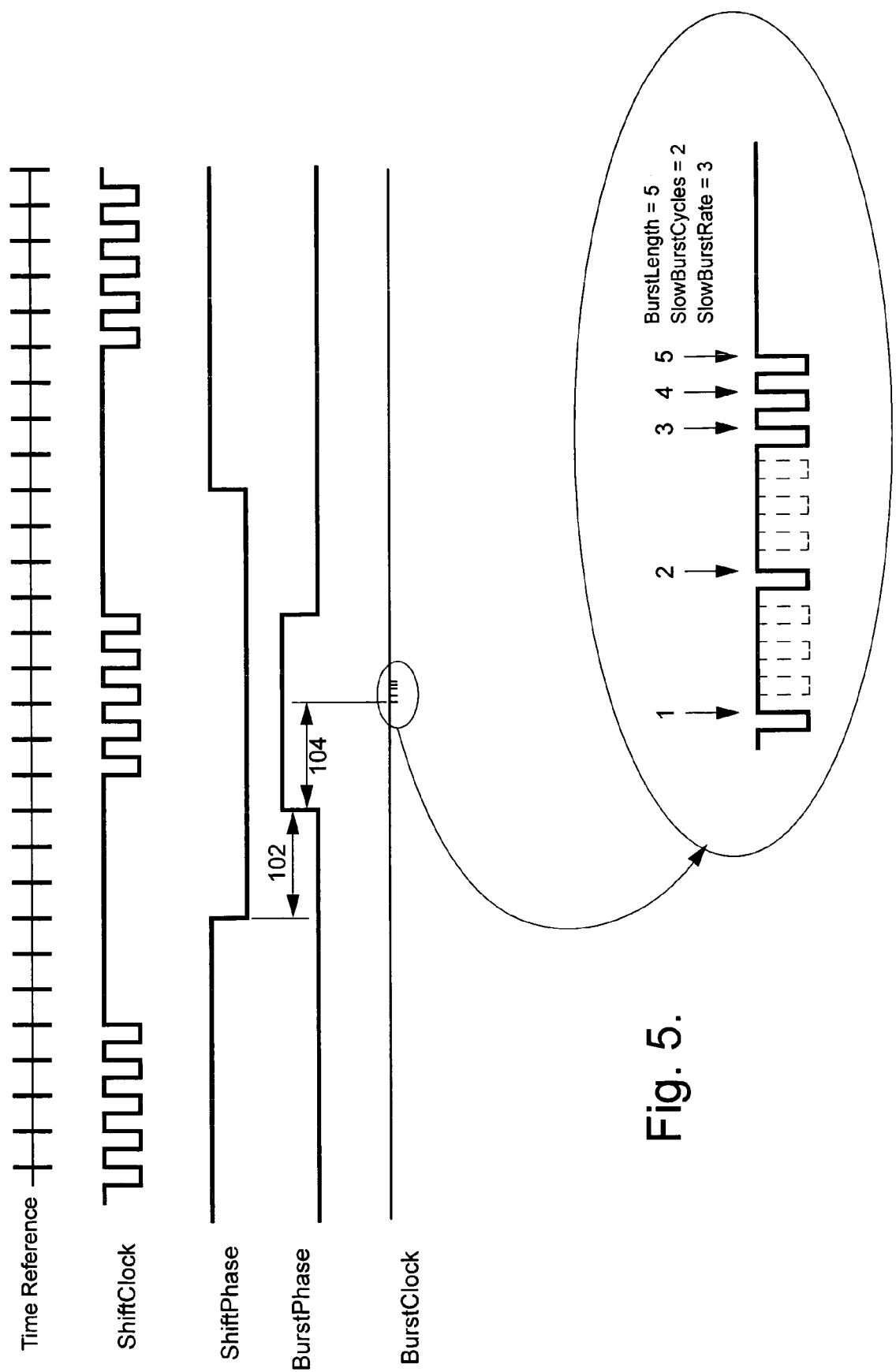
FIG. 5 is a timing diagram illustrating various signals according to an embodiment of the present invention, including a shift phase signal and a burst phase signal having a burst length of 5 clock cycles, a slow burst cycles of two clock cycles and a slow burst rate of three clock cycles.

FIG. 5 is a timing diagram which illustrates the foregoing. The figure includes a time reference based on the shift clock source, the shift clock signal, the ShiftPhase signal, the BurstPhase signal, the burst clock signal.

As can be seen, the ShiftPhase signal is high (active) during the shift phase, and otherwise is low. The BurstPhase signal is low (inactive) except for a period of time between two shift phase states. As can be seen, there may be a delay 102 between the rising edge of the BurstPhase signal and the falling edge of the ShiftPhase signal. This delay is generated by the ShiftPause state of the shift clock controller. It will also be seen that there is a delay 104 between the rising edge of the BurstPhase signal and commencement of the generation of burst clock pulses. For interacting synchronous clock domains, the BurstPhase signal is synchronized using the reference clock of the slowest clock domain. This causes a delay due to the synchronization of the BurstPhase to the burst clock source signal using at least two memory elements connected in series that are clocked by the burst clock source, as is well known in the art (see Applicant's U.S. Pat. No. 6,510,534;). This delay occurs in step 80.

The generated burst clock pulses are enlarged in the example timing diagram of FIG. 5 for clarity. The example is for a BurstLength of five pulses, a SlowBurstCycles value of two and a SlowBurstRate value of three. It will be seen that the pulses numbered 1 and 2 are demoted pulses so that the effective frequency of these demoted pulses is ¼ of the frequency of the burst reference clock source. For each pulse of the reference clock that is enabled, three pulses are disabled. Thus, pulses 1 and 2 are generated at lower frequency than that of the reference clock source. Pulses numbered 3, 4 and 5 are generated at the frequency of the reference clock source.

Edge Alignment

In order to test interacting synchronous clock domains at-speed the present invention aligns a selected edge of the interacting synchronous clock domains, by delaying commencement of burst of clock pulses after the BurstPhase signal becomes active as indicated above. The delay may differ in each clock domain depending on the clock frequency in each domain.

In general, this aspect of the method comprises, generating a burst phase signal following the shift phase; synchronizing the burst phase signal with the reference clock associated with the clock domain having the lowest clock frequency; and, for each clock domain: generating a burst of clock cycles derived from a reference clock signal associated with the clock domain; and prior to generating the burst of clock cycles, delaying commencement of the burst of clock cycles by a predetermined time interval so as to align a selected edge of the burst of clock cycles with a corresponding edge in all other interacting synchronous clock domains; and capturing a circuit response to a test pattern.

Figure 7:
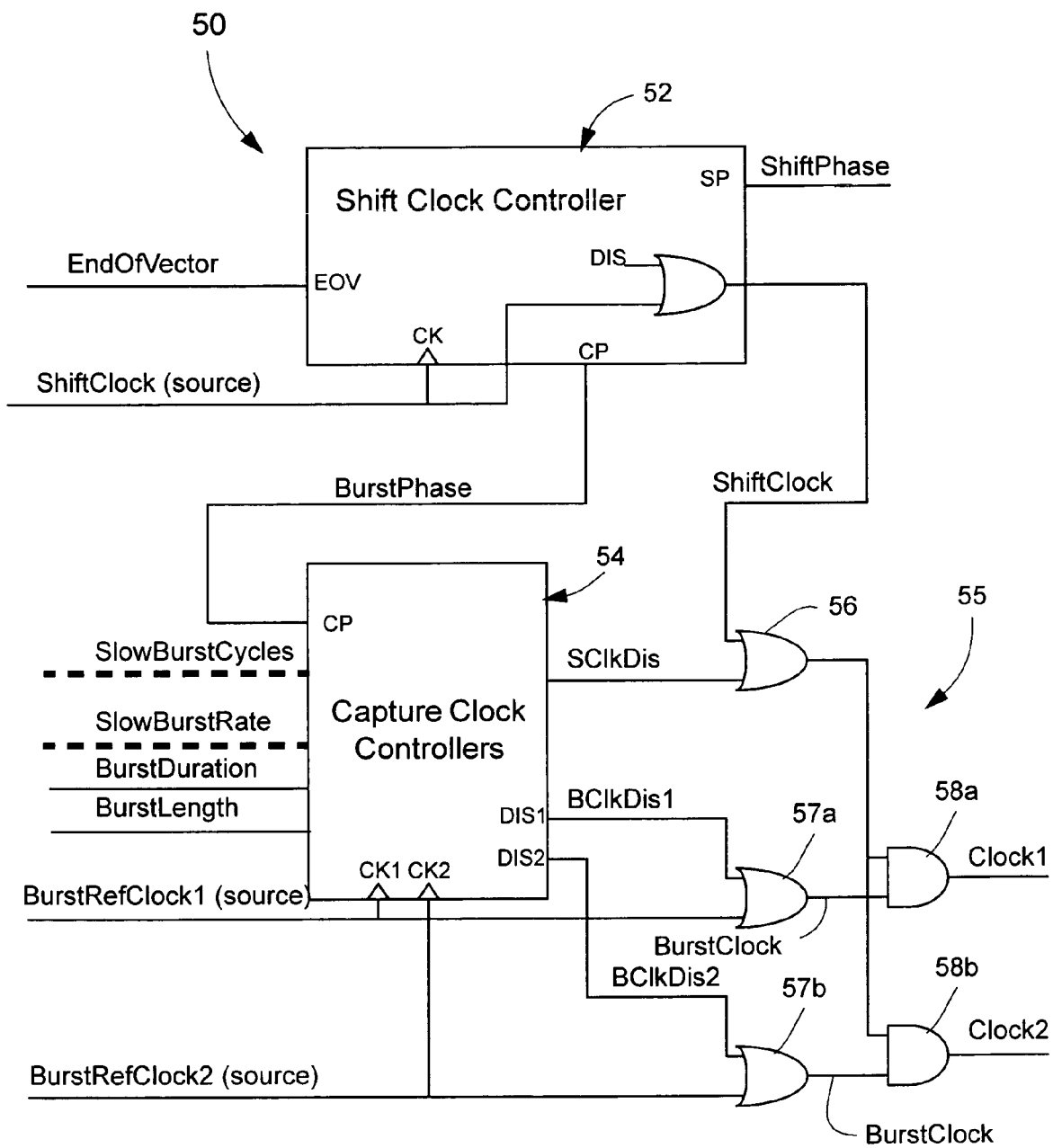
FIG. 7 is a more detailed schematic of a clock controller, according to an embodiment of the present invention, for use in generating clock signals for two interacting synchronous clock domains.

FIG. 7 illustrates an embodiment of the test clock controller for two interacting synchronous clock domains which require aligned clocks and whose burst clock signals are generated by one common burst clock controller. The figure shows a shift clock controller 52 and a burst clock controller 54.

As in the previous embodiment, the shift clock controller operates under control of a shift clock signal source, is responsive to EndOfVector and LastVector input signals and generates ShiftPhase and BurstPhase signals.

The burst clock controller generates a burst clock signal for each of the two interacting synchronous clock domains (not shown). As in the previous embodiment, the burst clock controller is responsive to the BurstPhase signal output by the shift clock controller as well as to the SlowBurstCycles and SlowBurstRate signals, if applicable. The burst clock signals that are generated are based on two reference clock signal sources, labeled BurstRefClock1 and BurstRefClock2. The clock controller includes, for each of the associated synchronous clock domains, circuitry (not shown) that generates and outputs the clock disable signals, BClkDis1 and BClkDis2. As previously indicated, when these signals are low, a pulse is generated and, when high, a pulse is disabled or suppressed.

The clock gating circuit 55 includes an OR gate 56 which couples the shift clock signal and a shift clock disable signal, SClkDis, generated by the burst clock controller during the burst phase. The output of the OR gate is applied to one input of each of two AND gates 58a and 58b and remains high throughout the burst phase. Similarly, the BClkDis1 and BClkDis2 signals are coupled to corresponding reference clock signal sources BurstRefClock1 and BurstRefClock2 by respective OR gates 57a and 57b whose outputs are BurstClock signals which are coupled to the other input of respective AND gates 58a and 58b. The outputs of the AND gates are the clock signals, Clock1 and Clock2, applied to the scan chains of the interacting synchronous clock domains.

For each group of interacting synchronous clock domains, it is also desirable to align either the last or the penultimate active burst clock edge (launch edge) of all domains in each group. FIG. 6(a) shows two clocks, clock1 and clock2 aligned on the last active clock edge. FIG. 6(b) shows clock1 and clock2 aligned on the penultimate active burst clock edge. This alignment allows for precise testing of timing relationships (setup and hold times) between clock domains.

Aforementioned application Ser. No. 10/739,055, discloses the basic principle that allows this alignment. The BurstPhase signal (referred to as a SHD signal) from the shift clock controller is first synchronized using the clock of the synchronous domain(s) with the lowest frequency. This synchronized version of the BurstPhase signal, or a delayed version of it, is then used by higher frequency domains to align the last active clock edge of the clock bursts. However, a different method is required for the clock controller of the present invention to handle demoted reference clock pulses. Also, the previous method only supports the alignment of the last active clock edge.

In addition to being able to align the penultimate active clock edge, the clock controller of the present invention can be made responsive to a clock alignment input signal, ClkAlignment, as shown in dashed lines in FIG. 2, that provides for dynamically changing the alignment during a test, potentially for each test vector. A value of 0 indicates alignment on the last active clock edge while a value of 1 indicates alignment on the penultimate active clock edge (or vice versa). Burst edges are aligned by delaying the start of burst clock pulses after the burst phase signal goes high. All FSMs which control the burst phase of synchronous domains can be made identical. The delay required at the beginning of each burst phase is calculated from the synchronized version of the BurstPhase signal as follows for the last edge aligned:

$$\text{Delay}_i = T_{ref} - (\text{SlowBurstCycles}_i * \text{SlowBurstRate}_i + \text{BurstLength}_i) * T_i \quad (1)$$

where:
i indicates a synchronous clock domain;
BurstLength specifies the number of burst clock cycles to be applied during the burst phase and may be assigned any value up to a predetermined maximum burst length value;
$T_i$ is the period of the reference clock of the synchronous clock domain i;
$T_{ref}$ is a reference period of time from the synchronized version of the BurstPhase signal to the aligned clock edges. It is the maximum of all times required to generate burst clock pulses in synchronous domains, i.e.:

$$\max((\text{SlowBurstCycles}_i * \text{SlowBurstRate}_i + \text{BurstLength}_i) * T_i) \quad (2)$$

In an implementation where SlowBurstCycles and SlowBurstRate are the same for all synchronous domains, the maximum will be dictated by the slowest frequency domain. Another common case is when BurstLength=2 and SlowBurstCycles=0 for all clock domains of a synchronous clock domain group. It allows testing for setup time of 1 clock period of the fastest clock as well as hold time between all synchronous clock domains of a group.

It will be noted that the SlowBurstCycles and SlowBurstRate signals may have a value of zero.

The delay can be implemented with a counter or a shift register controlled by the reference clock of the synchronous clock domain, BurstRefClock$_i$, BurstRefClock1 or BurstRefClock2, in the example of FIG. 7. Alternatively, the delay can be divided into a fixed part and a variable part. The fixed part of the delay can be calculated by:

$$\text{Delay}_{i\_fixed} = T_{ref} - (\text{SlowBurstCycles}_{i\_max} * \text{SlowBurstRate}_{i\_max} + \text{BurstLength}_i) * T_i \quad (3)$$

The delay can be derived from the counter which implements the delay for the clock domain with the lowest frequency to minimize the amount of circuitry needed and to allow the use of identical FSMs for all synchronous clock domains. The variable part of the delay must be implemented using BurstRefClock$_i$ and is calculated as follows:

$$\text{Delay}_{i\_variable} = (\text{SlowBurstCycles}_{i\_max} * \text{SlowBurstRate}_{i\_max} - \text{SlowBurstCycles}_i * \text{SlowBurstRate}_i) * T_i \quad (4)$$

When the penultimate active edge is aligned, as determined by the ClkAlignment signal, the delay required at the beginning of each burst phase is calculated from the synchronized version of the BurstPhase signal to the penultimate edge is calculated with the same equation as above except that the term BurstLength$_i$ is replaced by the term BurstLength$_i$−1 for all domains except the domain with the slowest frequency.

An integrated circuit may include burst clock controllers which include circuitry responsive to the SlowBurstCycles and SlowBurstRate signals and burst clock controllers having circuitry which is not designed to respond to these signals. In the later case, the delay equations would not include the SlowBurstCycles and SlowBurstRate terms in equation (1)–(4).

A further embodiment of the method of the present invention is to run a test in several steps when the number of clocks available on a tester is less than the number of clock domains with different frequencies. The burst clock of several domains is connected to the same source. When the burst clock applied during a test step is higher than that which the clock domain can sustain, the ClkDisable signal, shown in dashed lines in FIG. 2, is applied. The burst clock controllers respond to this signal by disabling the burst clock and using the shift clock to perform the capture burst (BClkDis=1 and SClkDis=0) so that the ShiftClock is used to perform the burst. In an embodiment where the burst length is not the same for all burst clock controllers, the shift clock controller must output several versions of the Shift-Clock which only differ by the number of clock pulses that occur during the burst phase. This feature allows obtaining the same signature for all test steps and results in less computational time and easier data management.

A further embodiment is to adjust the duration of the Burst state of the shift clock controller under control of a Burst-Duration signal applied to the shift clock controller. This optimizes duration based on the SlowBurstCycles, SlowBurstRate, BurstLength, and burst clock periods. Alternatively, the duration of the BurstPhase can be fixed to a sufficiently large value to accommodate all combinations of the above parameters.

A still further embodiment is to program an arbitrary burst length or select between preprogrammed burst lengths under control of the BurstLength signal. For example, a single bit signal can switch between preprogrammed burst length of 5 and 2 burst clock cycles.

Still another embodiment of the shift clock controller is a shift clock source selection mechanism (not shown) followed by a clock frequency divider (not shown) to optimize the shift rate for the test conditions that are in effect. For example, it might be necessary to reduce the shift rate during wafer test because of power supply limitations.

Clock gating logic 55 can use complex gates such as OR-AND gates. All examples shown herein assume an active rising edge for the clocks that are disabled by forcing an active (1) value. Inverters can be added on the shift clock, burst clock and the output of the clock gating logic to support an active falling edge for the clocks. Alternatively, AND-OR complex gates can be used and clock disabling can be performed by forcing an inactive (0) value. All these variations are well known to persons skilled in the art. Additional clock muxes can be inserted between the clock gating logic and the clock buffer without taking any special precautions in the case of asynchronous clocks. However, for synchronous clock domains, clock muxing will make it difficult to preserve clock alignment in all modes of operation of the circuit, test and functional.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A test clock controller for generating a test clock signal for scan chains in integrated circuits having one or more clock domains, comprising:
   a shift clock controller for generating a shift clock signal for use in loading test patterns into scan chains in said clock domains and for unloading a test response patterns from said scan chains and for generating a burst phase signal after loading a test pattern; and
   a burst clock controller responsive to a burst phase signal for generating a burst of clock pulses derived from a reference clock and including a first group of clock pulses having a selected reduced frequency relative to said reference clock and a second group of clock pulses having a frequency corresponding to that of said reference clock.

2. A test clock controller as defined in claim 1, further including a gating circuit for gating said reference clock with a reference clock pulse disabling signal, output by said burst clock controller, for generating a burst clock pulse.

3. A test clock controller as defined in claim 2, further including a burst clock controller associated with each of one or more of said clock domains.

4. A test clock controller as defined in claim 3, said burst clock controllers being operable to synchronize said burst phase signal with respective domain reference clock.

5. A test clock controller as defined in claim 4, each said pulse of said burst of clock cycles being generated by enabling a pulse of said reference clock.

6. A test clock controller as defined in claim 4, further including, burst clock controllers which control a group of interacting synchronous clock domains being operable to synchronize said burst phase signal with a reference clock associated with the clock domain having the lowest clock frequency and delay generation of said burst of clock pulses for respective predetermined time intervals so as to align a selected edge of the burst of clock cycles with a corresponding edge of all other clock domains of said group of interacting synchronous clock domains.

7. A test clock controller as defined in claim 6, said burst clock controller having a clock alignment input for receiving a clock alignment signal identifying the selected edge to be aligned.

8. A test clock controller as defined in claim 1, further including, said burst clock controller being responsive to a slow burst cycles signal indicative of a number of clock pulses to be included in said first group, a slow burst rate signal indicative of a number of reference clock pulses to be disabled following each pulse of said first group and a burst length signal indicative of the number of cycles of said burst of clock pulses.

9. A test clock controller as defined in claim 8, said burst clock controller having a predetermined burst length value.

10. A test clock controller as defined in claim 8, said burst clock controller being responsive to said burst length signal by selecting between preprogrammed burst length values.

11. A test clock controller as defined in claim 1, said shift clock controller having a shift clock output, each said burst clock controller having a reference clock pulse disabling output and a shift clock pulse disabling output, further including a clock gating circuit receiving said shift clock output, said reference clock, and said disable outputs for producing a clock signal to be applied to the clock input of scan memory elements in said clock domains.

12. A test clock controller as defined in claim 11, said shift clock controller being responsive to a burst phase duration signal for selectively adjusting the duration of a burst state of said shift clock controller.

13. A test clock controller as defined in claim 1, each burst clock controller having an input for a burst length signal indicative of the number of cycles of said burst of clock pulses.

14. A test clock controller as defined in claim 1, said shift clock controller further including a shift clock source selector and a clock frequency divider responsive to a clock source selector output for selecting a shift clock rate to be used during a scan test.

15. A test clock controller as defined in claim 1, said shift clock controller including a finite state machine having:
   an idle state;
   an initialization state;
   a shift state for asserting a shift phase signal for configuring scan chain memory elements in shift mode and shifting test patterns into said scan chains and unloading any circuit test response from said scan chains under control of a shift clock;
   a shift pause state for de-asserting said shift phase signal at the end of a test pattern shift operation and pausing a scan test for a number of shift clock cycles;
   a burst state for asserting a burst phase signal for activating burst clock controllers, said clock controllers generating a burst of reference clock cycles for launching a test pattern loaded into said scan chains during said shift state and capturing the response of said integrated circuit to said test pattern;
   a burst pause state for de-asserting said burst phase signal following a burst operation and pausing said scan test for a number of shift clock cycles and for returning to said shift state if further test patterns are to be processed; and
   a done state for deactivating said shift clock controller upon completion of processing of all test patterns to be processed.

16. A test clock controller as defined in claim 1, said burst clock controller further including:
   means responsive to a rising edge of said Burst Phase signal for synchronizing said Burst Phase signal with a domain reference clock;
   a pulse counter for counting clock pulses during said Burst Phase;
   a pulse counter for counting pulses of said first group;
   a circuit receiving a reference clock and operable to disable a predetermined number of reference clock cycles to produce a reduced frequency and thereafter generate clock pulses at the frequency of said reference clock signal.

17. A test clock controller as defined in claim 16, said circuit receiving a reference clock further including a counter for counting suppressed clock cycles of said reference clock signals following each pulse of said first group.

18. A test clock controller as defined in claim 1, said shift clock controller generating a shift clock signal during said burst phase, said burst clock controller being responsive to a reference clock disable signal for disabling said reference clock and enabling said shift clock as a reference clock source during said burst phase.

19. A method for at-speed testing of integrated circuits having one or more clock domains, said method having a shift phase for loading test patterns into scan chains in said clock domains and unloading test response patterns from said scan chains, and a burst phase for launching said test patterns and capturing test responses to said test patterns, said method comprising:
   generating a burst phase signal following said shift phase; and
   for each clock domain:
      synchronizing said burst phase signal with a reference clock signal of each clock domain;
      generating a burst of clock cycles derived from a reference clock signal associated with said clock domain, including:
         generating a first number of said clock cycles at a reduced frequency by disabling a second number of cycles following each of said first number of cycles and generating remaining cycles of said burst of clock cycles at the frequency of said reference clock signal.

20. A method as defined in claim 19, further including, for each group of interacting synchronous clock domains, synchronizing said burst phase signal with a reference clock associated with the clock domain having the lowest clock frequency and delaying commencement of said burst of clock pulses in each said domain for a respective predetermined time interval so as to align a selected clock edge with a corresponding clock in all other interacting synchronous clock domains.

21. A method as defined in claim 20, said selected edge being the penultimate clock edge of said burst of clock cycles.

22. A method as defined in claim 20, when said selected edge is the last edge of said burst of clock cycles, said delaying includes calculating a delay as follows:

$$\text{Delay}_i = T_{ref} - (\text{SlowBurstCycles}_i * \text{SlowBurstRate}_i + \text{BurstLength}_i) * T_i \qquad (1)$$

where:
   i is a synchronous clock domain in a group of interacting clock domains;
   SlowBurstCycles is said first number of first cycles;
   SlowBurstRate is said second number of cycles;
   BurstLength is the number of cycles of said burst of clock cycles;
   $T_i$ is the period of the reference clock signal of the synchronous clock domain;
   $T_{ref}$ is a reference period of time from the synchronized version of the Burst Phase signal to the aligned clock edges and is the maximum of all times required to generate said predetermined number of burst clock pulses in synchronous domains, determined as follows:

$$\max((\text{SlowBurstCycles}_i * \text{SlowBurstRate}_i + \text{BurstLength}_i) * T_i). \qquad (2)$$

23. A method as defined in claim 22, wherein when said selected edge is a penultimate edge of said burst of clock cycles, the delay is calculated using equation (1) but with the term $\text{BurstLength}_i$ being replaced by the term $\text{BurstLength}_i - 1$ for all domains except the domain with the slowest frequency.

24. A method as defined in claim 19, said selected edge being the last edge of said burst of clock cycles.

25. An at-speed scan test method for testing a circuit having interacting synchronous clock domains, said method having a shift phase for loading test patterns into scan chains in said clock domains and unloading test response patterns from said scan chains, and a burst phase for launching said test patterns and capturing test responses to said test patterns, said method comprising:
   generating a burst phase signal following said shift phase;
   synchronizing said burst phase signal with a reference clock associated with the clock domain having the lowest clock frequency; and,
   for each clock domain:
      generating a burst of clock cycles derived from a reference clock signal associated with said clock domain; and
      prior to said generating a burst of clock cycles, delaying commencement of said burst of clock cycles by a predetermined time interval so as to align a selected edge of said burst of clock cycles with a corresponding edge in all other interacting synchronous clock domains.

26. A method as defined in claim 25, said selected edge is the last edge of said burst of clock cycles.

27. A method as defined in claim 25, said selected edge is the penultimate edge of said burst of clock cycles.

28. A method as defined in claim 25, when said selected edge is the last edge of said burst of clock cycles, said delaying includes calculating a delay as follows:

$$\text{Delay}_i = T_{ref} - (\text{BurstLength}_i * T_i) \quad (5)$$

where:
- i is a synchronous clock domain in a group of interacting clock domains;
- $\text{BurstLength}_i$ is the number of cycles of said burst of clock cycles for clock domain i;
- $T_i$ is the period of the reference clock signal of the synchronous clock domain;
- $T_{ref}$ is a reference period of time from the synchronized version of the Burst Phase signal to the aligned clock edges and is the maximum of all times required to generate said predetermined number of burst clock pulses in synchronous domains, determined as follows:

$$\max(\text{BurstLength}_i) * T_i).$$

29. A method as defined in claim 28, wherein when said selected edge is a penultimate edge of said burst of clock cycles, the delay is calculated using equation (5) but with the term $\text{BurstLength}_i$ being replaced by the term $\text{BurstLength}_i - 1$ for all domains except the domain with the slowest frequency.

* * * * *